United States Patent [19]

Ito

[11] Patent Number: 6,051,457
[45] Date of Patent: Apr. 18, 2000

[54] METHOD FOR FABRICATING ELECTROSTATIC DISCHARGE PROTECTION DEVICE

[75] Inventor: Akira Ito, Palm Bay, Fla.

[73] Assignee: Intersil Corporation, Palm Bay, Fla.

[21] Appl. No.: 09/268,605

[22] Filed: Mar. 15, 1999

Related U.S. Application Data

[62] Division of application No. 08/596,079, Feb. 6, 1996, Pat. No. 5,883,414.

[51] Int. Cl.[7] .................................................. H01L 23/62
[52] U.S. Cl. ......................... 438/208; 438/328; 438/419; 438/983; 257/355; 257/606
[58] Field of Search .................................... 257/481, 357, 257/355, 606; 438/208, 328, 358, 419, 983

[56] References Cited

U.S. PATENT DOCUMENTS

| | | | |
|---|---|---|---|
| 4,683,483 | 7/1987 | Burmham | 438/983 |
| 5,336,920 | 8/1994 | Jimenez | 257/481 |
| 5,416,351 | 5/1995 | Ito et al. | 257/357 |
| 5,883,414 | 5/1999 | Ito . | |

OTHER PUBLICATIONS

Ito, et al., "A Fully Complementary BiCMOS Technology for 10 V Mixed–Signal Circuit Applications," *IEEE Transactions on Electron Devices*, vol. 41, No. 7, pp: 1149–1160 (Jul. 1994).

*Primary Examiner*—Chandra Chaudhari
*Assistant Examiner*—David S Blum
*Attorney, Agent, or Firm*—Jaeckle Fleischmann & Mugel, LLP

[57] ABSTRACT

An integrated circuit with a passive component and an ESD device in accordance with the present invention has: a P substrate; an N+ buried layer implanted in the P substrate; a cathode coupled to the N+ buried layer with an N area formed between the cathode and the N+ buried layer; an anode coupled to the N+ buried layer with a P area formed between the anode and the N+ buried layer; and a first P+ buried layer implanted in the N+ buried layer and below the P area to form a Zener diode. In an alternative embodiment, the ESD device may be incorporated in an integrated circuit with an active component.

4 Claims, 7 Drawing Sheets ies of five volts or less. Additionally, with the ESD device protecting a passive or an active component, the breakdown of the component is established by the breakdown voltage of the ESD device. When the active component is a field effect transistor, the ESD device is doped to have a breakdown voltage which is less than the voltage which would rupture the thin gate oxide layer in the field effect transistor. Further, the fabrication of the ESD device for protecting a passive or an active component in the integrated circuit does not require any additional masking steps because the integrated circuit with the ESD device uses existing fabrication steps to form the new circuit. In particular, the P+ buried layer that forms part of the zener diode is formed at the same time that the P+ buried layers used as isolation layers are formed.

METHOD FOR FABRICATING ELECTROSTATIC DISCHARGE PROTECTION DEVICE

This application is a divisional of application Ser. No. 08/596,079 filed Feb. 6, 1996, now U.S. Pat. No. 5,883,414.

FIELD OF THE INVENTION

This invention relates generally to an electrostatic discharge ("ESD") protection device and more particularly to a P+ buried layer/N+ buried layer Zener diode in an integrated circuit which is designed to protect a passive and/or an active component in the integrated circuit.

BACKGROUND OF THE INVENTION

Demands for increased performance and complexity for integrated circuits have led to the development of BiCMOS integrated circuits. BiCMOS integrated circuits are circuits which include CMOS transistors for high packing density and bipolar transistors for high power and speed.

One problem with BiCMOS integrated circuits is that they are prone to damage from ESD strikes. For example, to achieve sufficient performance digital CMOS transistors in a BiCMOS circuit needed a thin gate oxide layer, typically less than 130 angstroms, however the thin gate oxide layers in the digital CMOS transistors are prone to rupture during an ESD strike To protect against ESD strikes, ESD devices, such as Vceo diodes or Vebo diodes for bipolar circuits and NMOS or PMOS diodes or Zener diodes (if available) for CMOS circuits, have been placed between the input and output ("I/O") pins and the positive and negative voltage supply rails in BiCMOS integrated circuits. The ESD devices are nonlinear devices which present very high impedance to the integrated circuit under normal circuit operation, but quickly turn on into a very low impedance mode when the signal terminal reaches a certain threshold above the normal operating voltage. ESD energy dissipates through the ESD device by avalanche breakdown or punch-through, thereby creating a low impedance path. The breakdown voltage of the ESD device is set to be higher than the normal supply rail voltages, but sufficiently lower than the device in the integrated circuit the ESD device is designed to protect.

One example of an ESD device is disclosed in U.S. Pat. No. 5,416,351 to Ito et al. ("Ito") which is a Zener diode that is imbedded in and abuts the drain of a MOS device and which is herein incorporated by reference. With the Zener diode, the protection diode breakdown in the MOS device is determined by the breakdown voltage of the Zener diode which is nine volts. Although the ESD device in the BiCMOS integrated circuit disclosed above protects against some ESD strikes, it cannot be applied to advanced BiCMOS integrated circuits with an operating bias of five volts without an additional masking step to form a deeper and heavily doped junction under the drain. The deeper and heavily doped junction is needed to form a Zener diode. With the additional masking step the ESD device in the BiCMOS integrated circuit would operate, but the additional masking step is undesirable because it adds to a photomask count for fabricating the BiCMOS integrated circuit which is already high and expensive.

SUMMARY OF INVENTION

An integrated circuit with a passive component and an ESD device in accordance with the present invention has: a P substrate; an N+ buried layer implanted in the P substrate; a cathode coupled to the N+ buried layer with an N area formed between the cathode and the N+ buried layer; an anode coupled to the N+ buried layer with a P area formed between the anode and the N+ buried layer; and a first P+ buried layer implanted in the N+ buried layer and below the P area to form a Zener diode. In an alternative embodiment, the ESD device may be incorporated in an integrated circuit with an active component.

The integrated circuit with the ESD device provides several advantages. The ESD device works with advanced BiCMOS integrated circuits with an operating bias of five volts or less. Additionally, with the ESD device protecting a passive or an active component, the breakdown of the component is established by the breakdown voltage of the ESD device. When the active component is a field effect transistor, the ESD device is doped to have a breakdown voltage which is less than the voltage which would rupture the thin gate oxide layer in the field effect transistor. Further, the fabrication of the ESD device for protecting a passive or an active component in the integrated circuit does not require any additional masking steps because the integrated circuit with the ESD device uses existing fabrication steps to form the new circuit. In particular, the P+ buried layer that forms part of the zener diode is formed at the same time that the P+ buried layers used as isolation layers are formed.

DETAILED DESCRIPTION

Figure 1:
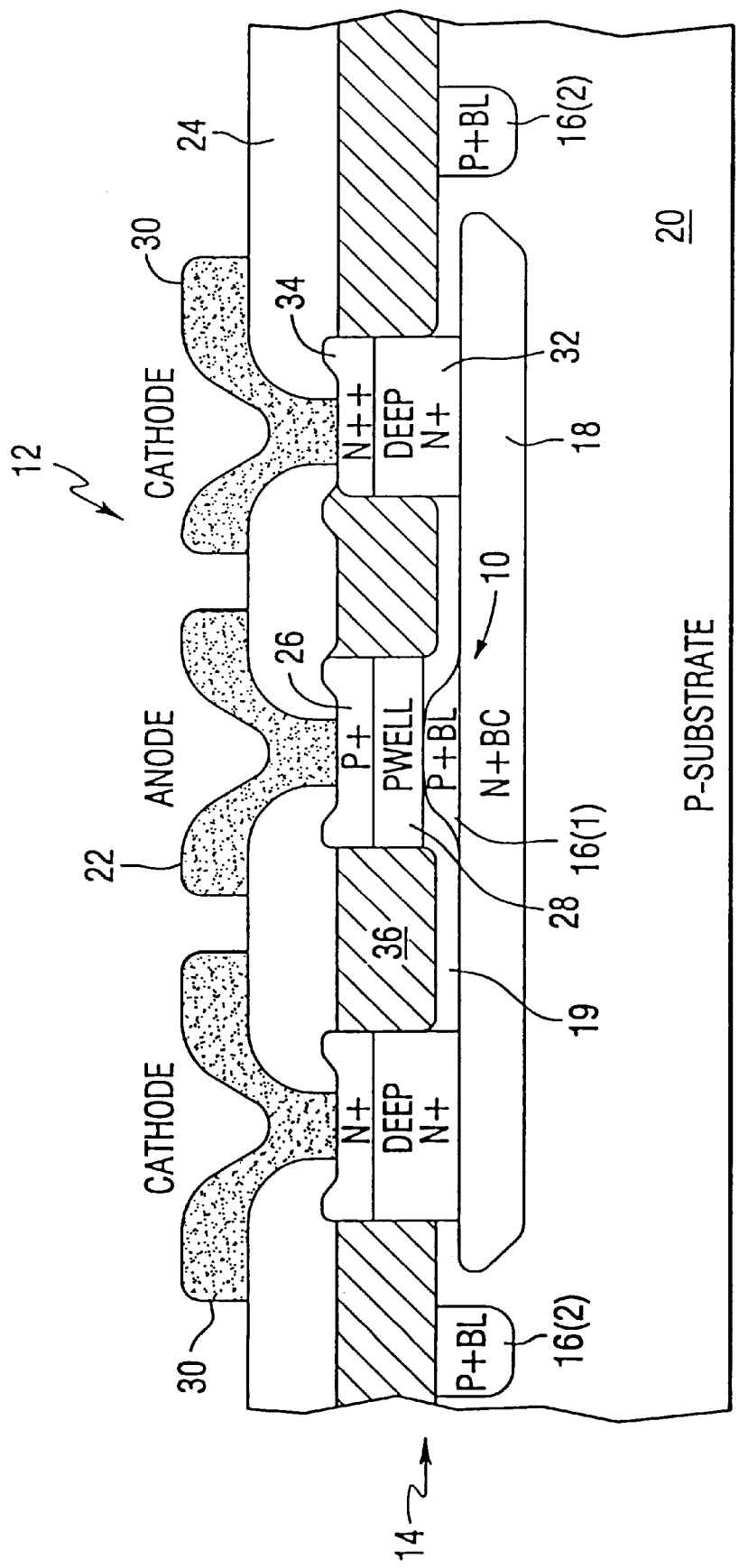
FIG. 1 is a cross-sectional view of an ESD device and a diode in an integrated circuit in accordance with the present invention.

An ESD device 10 and a diode 12 in an integrated circuit 14 in accordance with the present invention is illustrated in FIG. 1. ESD device 10 includes a P+ buried layer 16(1) which is implanted in an N+ buried layer 18 and forms a Zener diode. ESD device 10 works with advanced BiCMOS integrated circuits with an operating bias of five volts or less. With ESD device 10 protecting diode 12, the point at which diode 12 breaks down is established by the breakdown voltage of ESD device 10. Additionally, the fabrication of ESD device 10 for protecting diode 12 does not require any additional masking steps in the fabrication of integrated circuit 14. In particular, P+ buried layer 16(1) which forms part of ESD device 10 is formed at the same time that P+ buried layers 16(2) used as isolation layers are formed.

Referring more specifically to FIG. 1, integrated circuit 14 with ESD device 10 and diode 12 is formed on the surface of a P– substrate 20. N+ buried layer 18 is implanted in P– substrate 20 and in this particular embodiment is doped with a concentration of $3\times10^{15}$ arsenic ions/cm$^2$.

Integrated circuit 14 also includes an anode 22 which extends through an oxide layer 24 into a doped N epitaxial layer 19 and down towards N+ buried layer 18. A P+ region 26, a P well 28, and P+ buried layer 16 are located between anode 22 and N+ buried layer 18 with P+ region 26 adjacent anode 22, P well 28 between P+ region 26 and P+ buried layer 16, and P+ buried layer 16(1) adjacent N+ buried layer 18. P+ buried layer 16(2) may also be implanted in P− substrate 20 adjacent to and on both sides of N+ buried layer I to form isolation layers.

P+ buried layer 16(1) adjacent N+ buried layer 18 forms a Zener diode which acts as the ESD device 10. The Zener diode should present a high impedance path until an ESD strike and then should provide a low impedance path. The breakdown voltage for the Zener diode should be greater than the operating voltage for the integrated circuit and less than the breakdown voltage for the device the Zener diode is designed to protect from an ESD strike. In this particular embodiment, to have a breakdown voltage of eight volts P+ buried layer 16(1) is doped with a concentration of $8 \times 10^{14}$ boron ions/cm$^2$, to have a breakdown voltage of twelve volts P+ buried layer 16(1) is doped with a concentration of $4 \times 10^{14}$ boron ions/cm$^2$, and to have a breakdown voltage of twenty volts P+ buried layer 16(1) is doped with a concentration of $2 \times 10^{14}$ boron ions/cm$^2$.

Integrated circuit 14 also includes a cathode 30 which extends through oxide layer 24 into doped N epitaxial layer 19 and down towards N+ buried layer 18. A first N+ region 32 and a second N++ region 34 are located between N+ buried layer 18 and cathode 30, with second N++ region 34, which is adjacent cathode 30, having a higher doping concentration than first N+ region 32, which is adjacent N+ buried layer 18. In this particular embodiment, first N+ region 32 is doped with phosphorus by POCl$_3$ at 890 C. and second N++ region 34 is doped with $5 \times 10^{15}$ arsenic ions/cm$^2$. Layer 36 separates portions of N epitaxial layer 19 and oxide layer 24.

Integrated circuit 14 operates like a typical diode between anode 22 and cathode 30. When a negative voltage ESD spike strikes anode 22, avalanche breakdown occurs at the junction of P+ buried layer 16 and N+ buried layer 18, rather than being determined by the unknown breakdown voltage between P+ region 26 and N+ buried layer 18.

Figure 5:
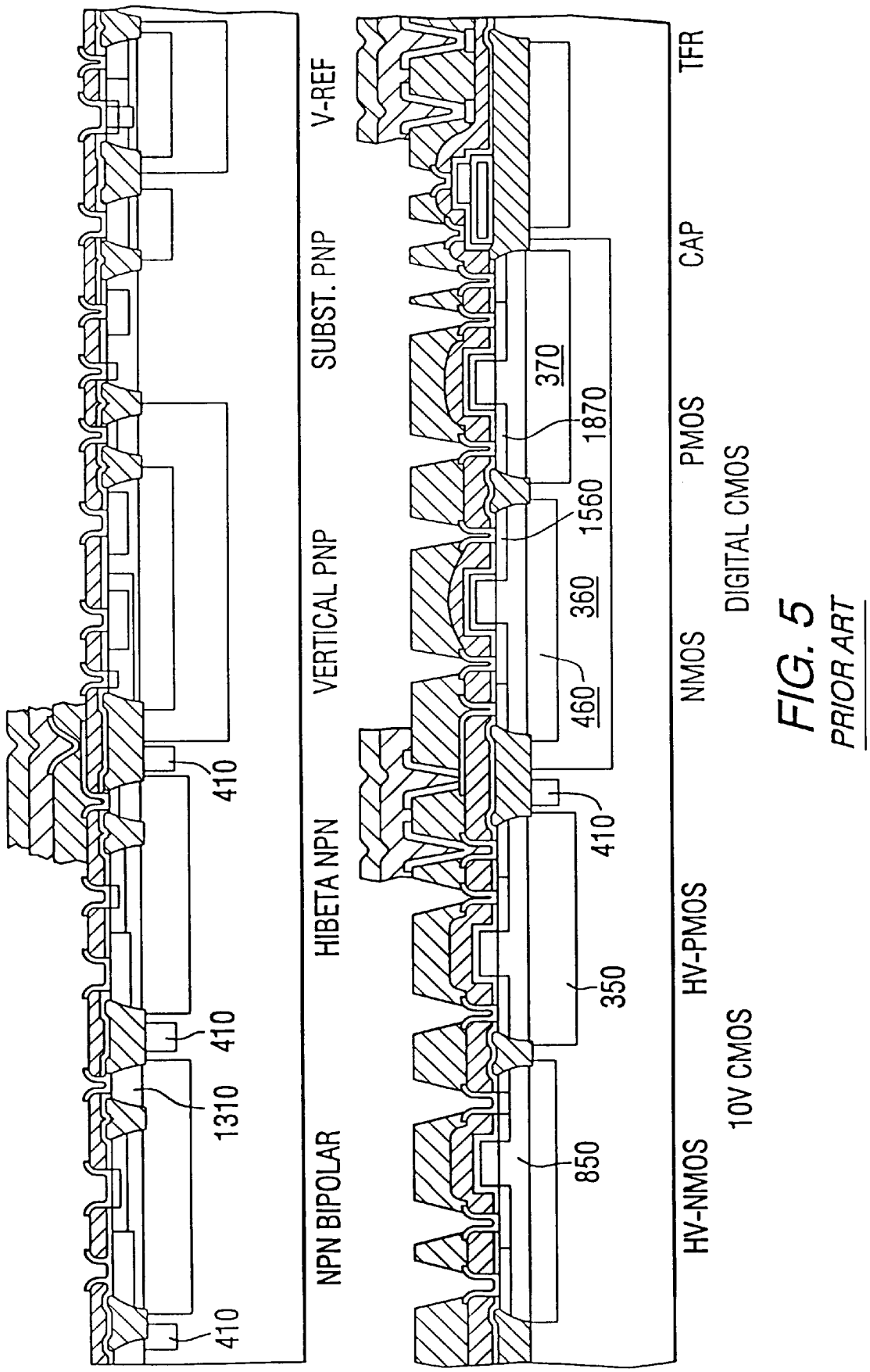
FIG. 5 is a cross-sectional view of a prior art BiCMOS integrated circuit with a prior art ESD device.

Referring to FIGS. 2(a–g), cross-sectional views of the fabrication of the integrated circuit 14 with ESD device 10 are illustrated and referring to FIG. 5 a cross-sectional view of a prior art BiCMOS integrated circuit with a prior art ESD device from U.S. Pat. No. 5,416,351 to Ito et al. which is herein incorporated by reference is illustrated. ESD device 10 can be formed without any additional masking steps in the fabrication of integrated circuit 14 because a P+ buried layer 16(1) that forms part of ESD device 10 is formed at the same time that the P+ buried layers 16(2) used for isolation layers are formed. As shown in FIG. 2(a), the fabrication of integrated circuit 14 begins with P− substrate 20 although other types of substrates could be used.

Figure 2A:
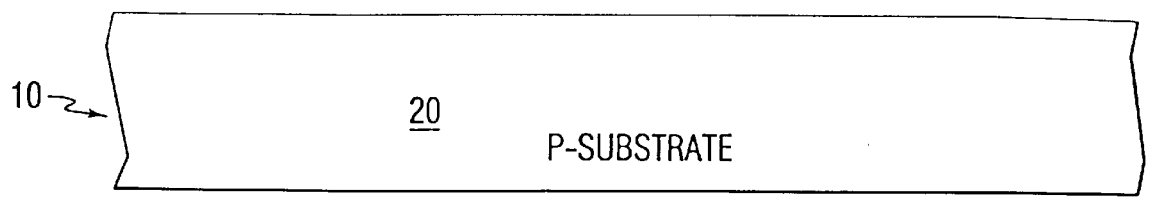
FIGS. 2(a–h) are cross-sectional views of the fabrication of the integrated circuit with the ESD device and the diode illustrated in FIG. 1.
Figure 2B:
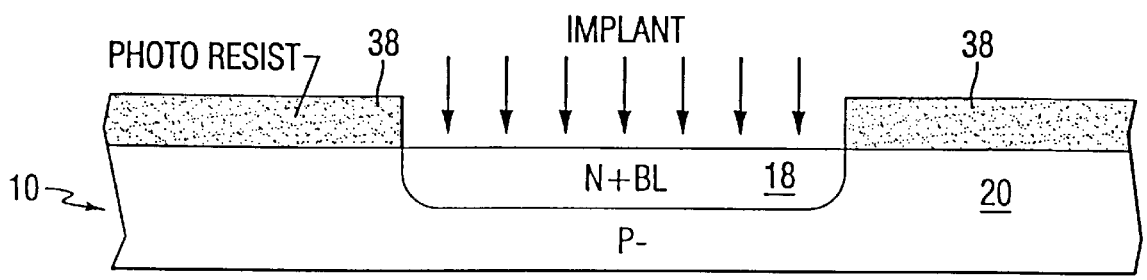

Next as shown in FIG. 2(b), a layer of photoresist material 38 is deposited over P− substrate 20. Once photoresist material 38 is deposited, photoresist material 38 is patterned to form an ion implant mask. Using the ion implant mask, N type dopant is implanted in the exposed areas not covered by the mask (as shown by the arrows). In this particular embodiment, N type dopant is implanted in P− substrate 20 at a concentration of $3 \times 10^{15}$ arsenic ions/cm$^2$. The implantation of the N type dopant forms an elongated N+ buried layer 18 in the P− substrate. Once the implantation is completed, the ion implant mask is removed. The formation of N+ buried layer 18 does not add an additional masking step to the fabrication process because N+ buried layer 18 is formed at the same time as N buried layer 350 in the prior art BiCMOS integrated circuit shown in FIG. 5.

Figure 2C:
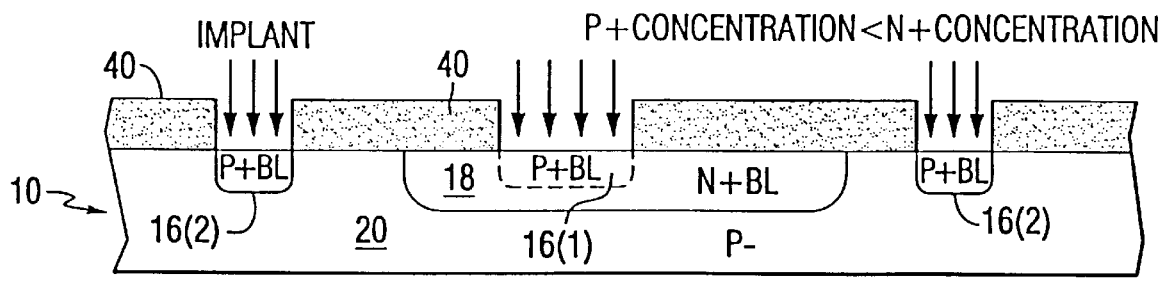

Once N+ buried layer 18 is formed, another layer of photoresist material 40 is deposited over P− substrate 20 and N+ buried layer 18, as shown in FIG. 2(c). Once photoresist material 40 is deposited, photoresist material 40 is patterned to form another ion implant mask. Using the ion implant mask P type dopant is implanted in the exposed areas not covered by the mask (as shown by the arrows). In this particular embodiment, P type dopant is implanted in P− substrate 20 and N+ buried layer 18 at a concentration of $8 \times 10^{14}$ Boron ions/cm$^2$. The ion implant mask permits dopant to be implanted into N+ buried layer 18 to form P+ buried layer 16(1) and into the P− substrate, adjacent to each side of the N+ buried layer 18, to form two additional P+ buried layers 16(2) which act as isolation layers. P+ buried layer 16(1) implanted in N+ buried layer 18 forms a Zener diode which is ESD device 10 for integrated circuit 14. Again the formation of P+ buried layer 16(1) does not add an additional masking step to the fabrication process because P+ buried layer 16(1) is formed at the same time as P+ buried layers 410 in the prior art BiCMOS integrated circuit shown in FIG. 5.

Figure 2D:
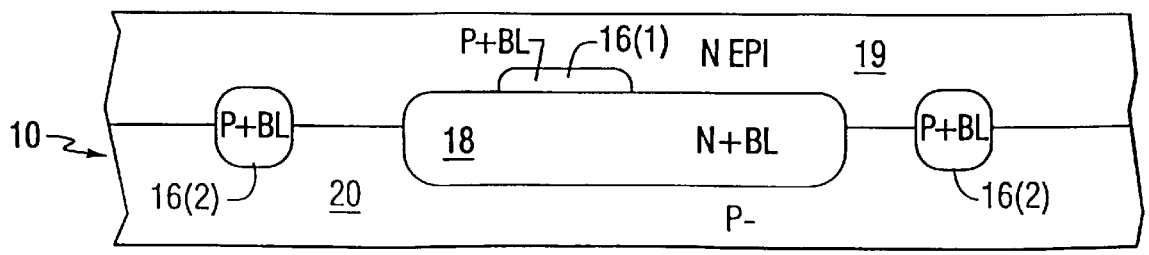

Next as shown in FIG. 2(d), an N epitaxial layer 19 is grown on P− substrate 20, P+ buried layer 16(1) and 16(2), and N+ buried layer 18. In this particular embodiment, N epitaxial layer 19 has a thickness between 0.5 micrometers and 2 micrometers, although the thickness and doping of N epitaxial layer 19 can vary as desired and needed.

Figure 2E:
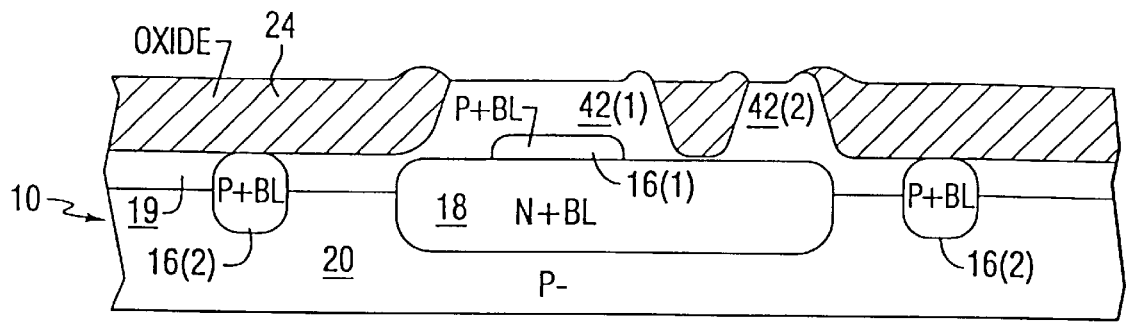

Once N epitaxial layer 19 is grown, active areas 42(1) and 42(2) for integrated circuit 14 are defined, as shown in FIG. 2(e). N epitaxial layer 19 is etched to define first active area 42(1) over P+ buried layer 16(1) implanted in N+ buried layer 18 and second active area 42(2) adjacent to first active area 42(1) and over N+ buried layer 18. For ease of illustration, only the fabrication of one connection to cathode 20 through second active area 42(2) is shown because the fabrication of connections to both cathodes 30 in FIG. 1 is the same. Oxide layer 24 is grown over the remaining N epitaxial layer 14.

Figure 2F:
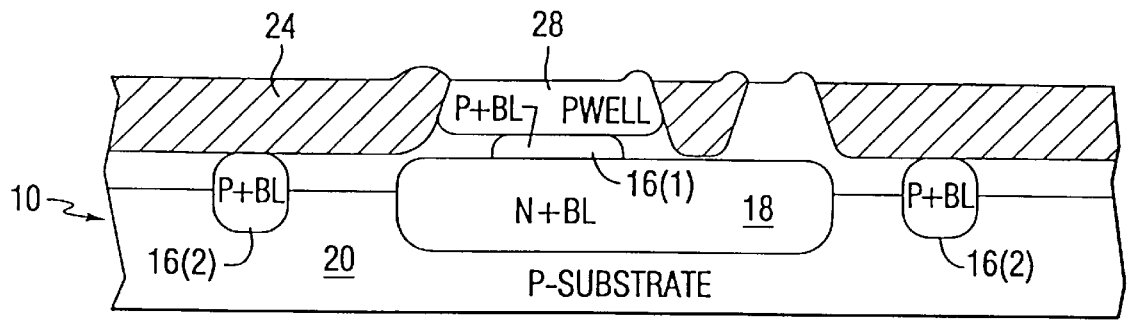

Next as shown in FIG. 2(f), P well 28 is formed in the portion of first active area 42(1) over P+ buried layer 16(1). P well 28 is formed by ion implantation of boron at a concentration of $4 \times 10^{12}$ ions/cm$^2$ and functions to vertically connect P+ layer 26 to P+ buried layer 16(1). Again the formation of P well 28 does not add an additional masking step to the fabrication process because P well 28 is formed at the same time as P well 850 in the prior art BiCMOS integrated circuit shown in FIG. 5.

Figure 2G:
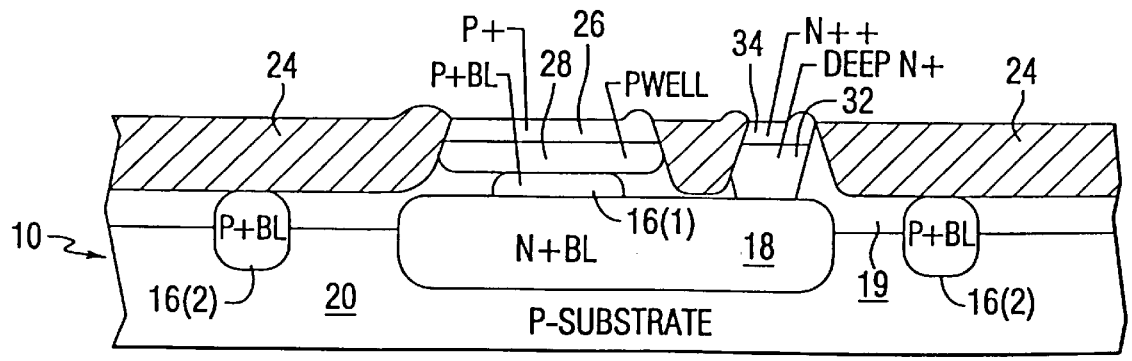

Finally as shown in FIG. 2(g), P+ region 26 is implanted in P well 28 and then anode 22 (shown in FIG. 1) is deposited on P+ region 26. Additionally, first N+ region 32 is doped with phosphorus by POCl$_3$ in second active area 42(2) over N++ buried layer 18, a second N+ region 34 is implanted over the top of second N++ region 34, first N+ region 32 has a higher concentration of dopant than first N+ region 32, and cathode 30 is deposited on second N++ region 34. Again, the formation of P+ region 26, first N+ region 32, and second N++ region 34 do not add any additional masking steps to the fabrication process because P+ region 26 is formed at the same time as P+ layer 1870, first N+ region 32 is formed at the same time as deep N+ 1310, and second N++ region 34 is formed at the same time as N+ region 1560, in the prior art BiCMOS integrated circuit shown in FIG. 5. Accordingly as shown above, the fabrication of ESD device 10 does not involve any additional masking steps over the prior fabrication process.

Figure 2H:
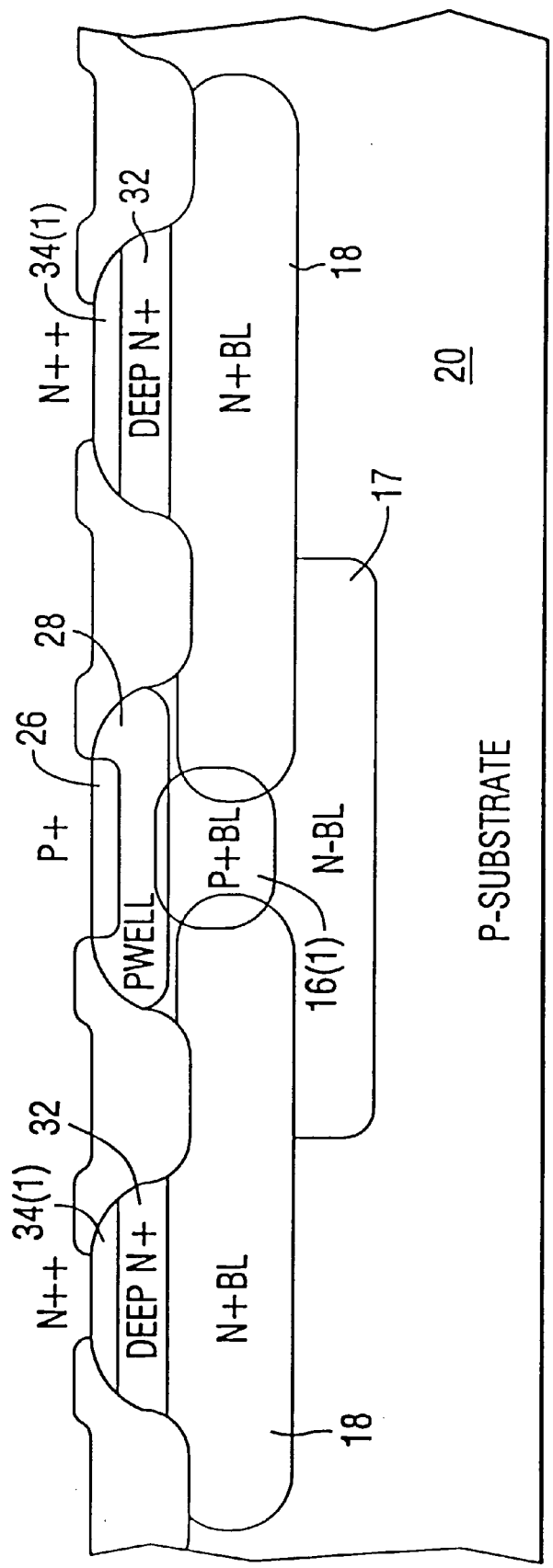

Referring to FIG. 2(h), an alternative embodiment for the integrated circuit with the ESD device is shown. In this particular embodiment, the Zener breakdown voltage is adjusted by the N+ buried layer configuration and by the dopant concentrations of the N+ and P+ buried layers. With this integrated circuit, an N− buried layer 17 is formed in P− substrate 20 and acts as an isolation layer. The N− buried layer 17 is formed at the same time as N− buried layer 360 in the prior art BiCMOS integrated circuit shown in FIG. 5. Next, an N+ buried layer 18 is implanted in the N− buried layer 17. The N+ buried layer is formed at the same time as N buried layer 350 in the prior art BiCMOS integrated circuit shown in FIG. 5. Next, a hole is formed in N+ buried layer 18, which extends to the N− buried layer, with a simple change to one of the masks. No additional masking step is needed to form the hole. Next, a P+ buried layer 16(1) is deposited in the hole. The P+ buried layer is formed at the same time as P+ buried layer 410 in the prior art BiCMOS integrated cirucit shown in FIG. 5. The remaining a P+ layer 26, a P well 28, and deep N+ layer 32 are formed in the same manner as previously described with reference to FIGS. 2(d–g). An N++ layer 34(1) is implanted in the deep N+ layer 32. The N++ layer 34(1) is formed at the same time as N buried layer 370 in the prior art BiCMOS integrated cirucit shown in FIG. 5.

Figure 3:
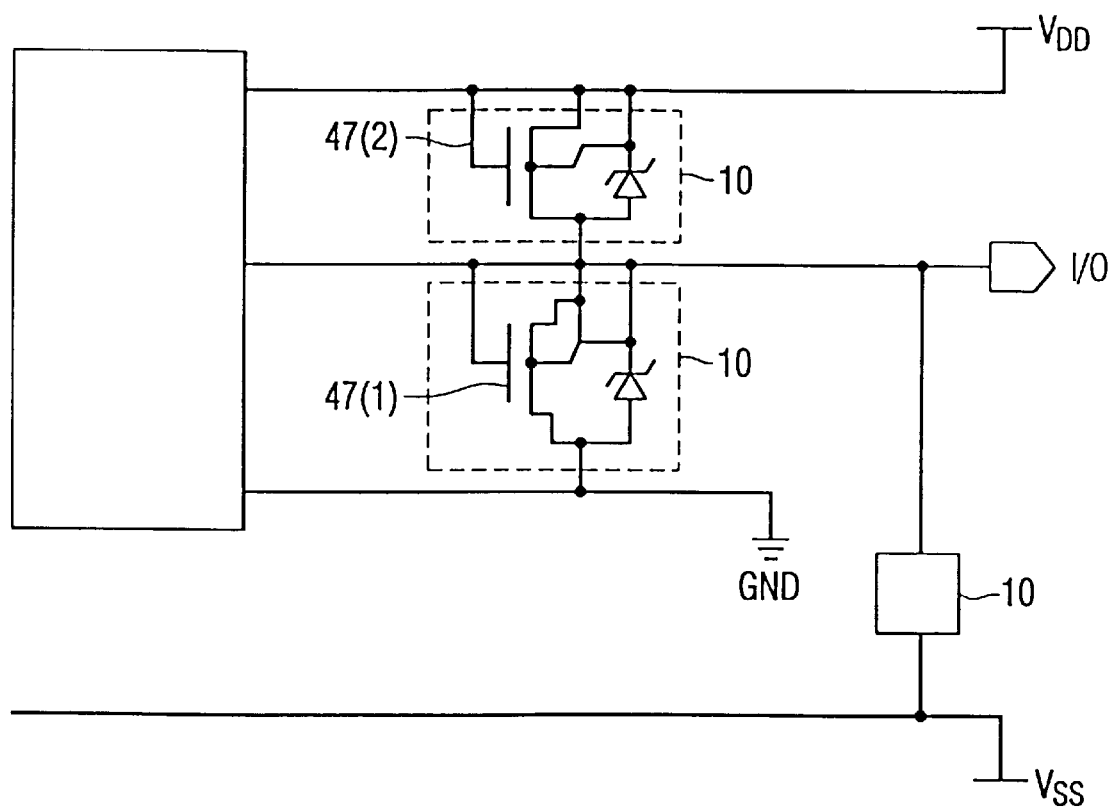
FIG. 3 is a block diagram of ESD devices in a BiCMOS integrated circuit.

Referring to FIG. 3, a block diagram of ESD device 10 in a BiCMOS integrated circuit 44 is illustrated. ESD devices 10 are located between positive and negative voltage supply rails, Vdd and Vss, between Vdd and ground, and between Vss and ground and provide a high impedance path until an ESD strike. The ESD strike causes ESD devices 10 to experience avalanche breakdown which creates a low impedance path.

Figure 4:
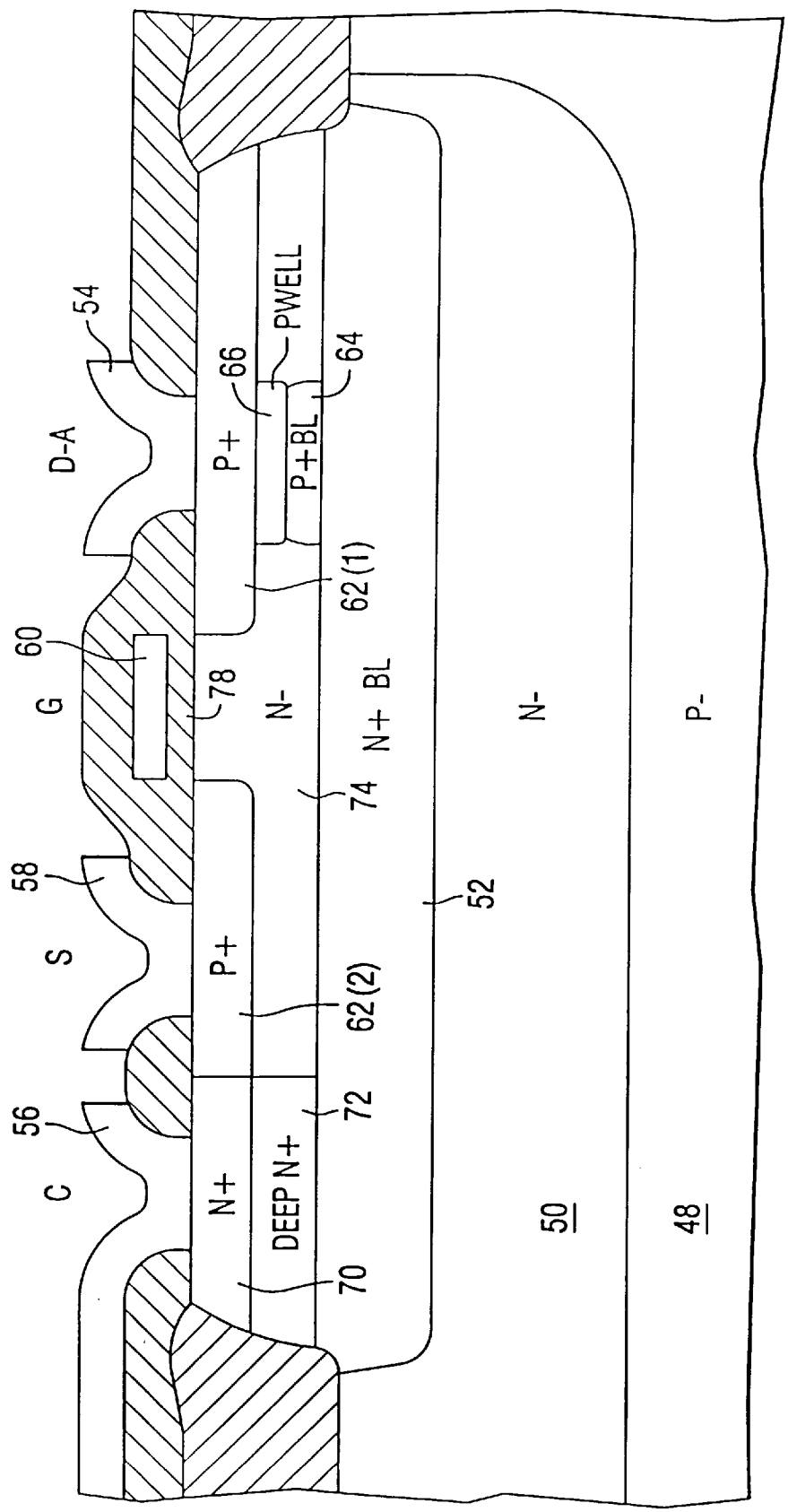
FIG. 4 is a cross-sectional view of a portion of the integrated circuit with the ESD device and a field effect transistor illustrated in FIG. 3.

Referring to FIG. 4, a cross-sectional view of a portion of BiCMOS integrated circuit 44 with ESD device 10 and a field effect transistor 46 shown in FIG. 3 is illustrated. Integrated circuit 44 is formed on a P− substrate 48 with an N− layer 50 implanted in P− substrate 48 and an N+ buried layer 52 implanted in N− layer 50.

Integrated circuit 44 includes a drain/anode 54, a cathode 56, a source 58, and a gate 60. A P+ region 62 abuts drain/anode 54 with a P+ buried layer 64 implanted in N+ buried layer 52 and a P well 66 separating P+ region 62(1) and P+ buried layer 64. P+ buried layer 64 and N+ buried layer 52 form a Zener diode which is ESD device 10 for the field effect transistor 46.

An N+ region 70 abuts cathode 56 and a heavily doped N+ region 72 is implanted in and abuts N+ buried layer 52. A P+ region 62(2) abuts source 58 and is separated from N+ buried layer 52 by an N− layer 74. An oxide layer 78, which is formed over integrated circuit 44, isolates gate 60 from N− layer 74. Oxide layer 78 under gate 60 is thin, typically having a thickness ranging from 10 nm to 18 nm and thus is prone to rupture by ESD strikes.

When a negative voltage ESD spike strikes drain/anode 54, avalanche breakdown occurs at the junction of P+ buried layer 64 and N+ buried layer 52 which provides a Zener current which turns on the PNP bipolar transistor formed by P+ regions 62(1) and 62(2) and N− layer 74. The breakdown is not determined by the doping of P+ region 62(2) and N− layer 74, but instead by the breakdown voltage of the Zener diode formed by P+ buried layer 64 and N+ buried layer 52.

As discussed above, the breakdown voltage of the Zener diode can be controlled by the doping of P+ buried layer 64. The P+ buried layer is doped so that the voltage drop across the Zener diode is lower than the rupture voltage of gate oxide layer 78. As a result, the Zener diode will breakdown before gate oxide layer 78 ruptures protecting the circuit.

Having thus described the basic concept of the invention, it will be readily apparent to those skilled in the art that the foregoing detailed disclosure is intended to be presented by way of example only, and is not limiting. Various alterations, improvements and modifications will occur and are intended for those skilled in the art, though not expressly stated herein. These modifications, alterations and improvements are intended to be suggested hereby, and are within the spirit and scope of the invention. Accordingly, the invention is limited only by the following claims and equivalence thereto.

What is claimed is:

1. A method of fabricating an integrated circuit with an electrostatic discharge protection device comprising the steps of:

patterning a first photoresist directly on a P substrate;

implanting an N+ buried layer into the P substrate using the first patterned photoresist as an implant mask;

patterning a second photoresist on the N+ buried layer;

implanting a P+ buried layer in and on a top portion of the N+ buried layer using the second patterned photoresist as an implant mask;

growing an N epitaxial layer over the P substrate, the N+ buried layer, and the P+ buried layer;

etching the N epitaxial layer to define a first active area over the P+ buried layer and a second active area over the N+ buried layer, the first and second active areas separated by a gate oxide layer;

implanting a P area over the P+ buried layer;

implanting an N area over the N+ buried layer; and depositing a cathode over the N area and an anode over the P area.

2. The method of fabricating an integrated circuit as set forth in claim 1 wherein the step of implanting a P area further comprises the steps of:

forming a P well over the P+ buried layer; and implanting a P+ region over the P well.

3. The method of fabricating an integrated circuit as set forth in claim 1 wherein the step of implanting an N area further comprises the steps of:

implanting a first N+ region over the N+ buried layer; and implanting a second N++ region over the second N++ region, the first N+ region being more heavily doped than the first N+ region.

4. The method of fabricating set forth in claim 1 wherein the step of implanting a P+ buried layer further comprises using, the second patterned photoresist as an implant mask for implanting a P+ buried layer into the P substrate adjacent each side of the N+ buried layer.

* * * * *